United States Patent [19]

Lindenfelser

[11] Patent Number: 4,692,786

[45] Date of Patent: Sep. 8, 1987

[54] SEMI-CONDUCTOR DEVICE WITH SANDWICH PASSIVATION COATING

[76] Inventor: Timothy M. Lindenfelser, 1500 Towerview Rd., Eagan, Minn. 55164

[21] Appl. No.: 898,717

[22] Filed: Aug. 21, 1986

Related U.S. Application Data

[62] Division of Ser. No. 699,028, Feb. 7, 1985, Pat. No. 4,614,666.

[51] Int. Cl.[4] .......................................... H01L 21/316
[52] U.S. Cl. ........................................ 357/54; 357/68; 437/235; 437/238; 437/241
[58] Field of Search ...................... 357/54, 68; 427/88

[56] References Cited

U.S. PATENT DOCUMENTS 4,110,125  8/1978  Beyer ..................................... 427/93
4,395,438  7/1983  Chiang ................................... 427/94

*Primary Examiner*—John D. Smith

*Attorney, Agent, or Firm*—Ratner & Prestia

[57] ABSTRACT

Improved silicon semi-conductor device and process includes three layer sandwich passivation coating. The sandwich coating comprises first, a thin silica layer, preferably produced by oxidizing a silicon surface to the minimum thickness necessary to prevent interdiffusion of an overlying nitride layer with the silicon subsurface. The second layer of the sandwich construction is nitride and the third layer is a thicker layer of silica, preferably produced by plasma glass deposition which, together with the inner silica layer provides preselected electrical characteristics required of the composite barrier or passivation coating. This invention reduces manufacturing defects produced in conventional two layer passivation coatings, including a thicker silica inner layer, due to undercutting of the thicker silica inner layer upon etching to form terminal areas. Such undercutting is avoided by the thin silica inner layer in the present invention.

2 Claims, 4 Drawing Figures

SEMI-CONDUCTOR DEVICE WITH SANDWICH PASSIVATION COATING

This application is a divisional of application Ser. No. 699,028 filed Feb. 7, 1985, now U.S. Pat. No. 4,614,666.

FIELD OF THE INVENTION

This invention pertains to semi-conductor devices having improved silicon passivation coatings and to methods of making such devices with greater precision and with fewer defects.

BACKGROUND OF THE INVENTION

The forming of semi-conductor devices, particularly including integrated circuits, by successive etching and depositing of materials on a silicon wafer or chip is a well known process. Such devices generally include a surface with at least one functional semi-conductor area separated from surrounding areas on the surface by an isolation barrier. Electrical contact with selected portions of the semi-conductor area is made by metallic contacts and connecting leads. Typically these contacts and leads comprise sputtered aluminum deposited over a metallic base layer, formed of titanium-tungsten for example. This base layer prevents diffusion of aluminum into the silicon base of the chip, in which aluminum is soluble.

Surrounding the terminal points or portions where electrical contact is made with the semi-conductor area and interposed between the conductive leads or pathways between those points and the underlying surface is a passivation coating. This passivation coating (also referred to sometimes as a diffusion barrier coating) covers the silicon surface and protects it from bombardment or diffusion with contaminant ions. Silicon dioxide (silica) which ordinarily comprises a significant part of this barrier, is easily formed by oxidation of the underlying silicon surface. Certain ions, most particularly alkaline metal ions such as ions of sodium and potassium, require a separate diffusion barrier. For this purpose, a nitride layer is often placed over the silica sublayer of the passivation or diffusion barrier coating.

The passivation coating also serves as an insulator between the conductive leads and the underlying chip surface. In this respect, the electrical characteristics of the passivation coating are significant, since the insulative and capacitance values of this coating are factors in circuit design.

It is common to first deposit the silica part of the passivation or barrier coating by oxidation of the silicon chip surface to a thickness on the order of 2000-3000 Å. A nitride layer is then formed in accordance with conventional techniques by low pressure vapor deposition at elevated temperature, on the order of 800° C. from a 200 mtorr atmosphere. The nitride-silica passivation coating is then etched to expose portions of the semi-conductor area on the silicon chip, in which the titanium tungsten sublayer and then the aluminum overlayer are deposited. At the same time the electrically conducting pathways are similarly deposited (over the passivation coating) to form conducting paths connected to at least one of the terminals or points in the semi-conductor area.

In the course of this process, at least one of the semi-conductor area portions is typically doped with an emitter dopant, such as phosphorous. And the nitride layer of the composite passivation coating may serve as a mask for the emitter dopant.

Otherwise a variety of masks, particularly including photographically developable resists, are used to selectively deposit, etch, or mask different areas of the chip surface in which various parts of the process are to be conducted.

In the course of manufacturing integrated circuit silicon chips as heretofore described, a variety of problems arise particularly including the production of an excessive number of defective circuits, thus adding to the cost of the manufacturing process. To some degree, these manufacturing defects are attributable to the inclusion of the nitride in the passivation layer. In some manufacturing processes this nitride layer is omitted, but this can be done only at the expense of circuit design requiring greater spacing between terminal points and other safety factors.

It is therefore an object of the present invention to provide an improved manufacturing process and passivation coating structure which includes the nitride sublayer and avoids certain defects and inherent manufacturing problems experienced in prior designs and manufacturing processes.

BRIEF DESCRIPTION OF THE INVENTION

Briefly, the present invention comprises a semi-conductor device with a modified passivation coating design and manufacturing process based on a sandwich construction. This sandwich construction includes a first layer of silica of minimum thickness but thick enough (300–500 Å) to prevent contact of nitride onto the underlying silicon surface. This is done to prevent interfacial stress which is usually found when nitride is directly deposited on silicon. The second layer of the sandwich is nitride and the third or outer layer is silica formed over the nitride layer to complete the passivation coating.

The thickness of the outer silica layer in the sandwich composite passivation coating is determined by the total silica required (in the inner and outer silica layers) to meet design requirements, i.e. so that the passivation layer will have the necessary diffusion barrier, insulation and capacitance properties. Most particularly the total silica thickness is typically related to a preselected capacitance which is required between the underlying silicon surface and any overlying conductive leads or pathways. These factors dictate the thickness of the outer silica layer only because, in accordance with the present invention, the thickness of the first or inner silica layer is deliberately minimized.

Preferably, the first or inner silica layer of the sandwich composite passivation coating is produced, as in other prior processes, by oxidizing the silicon subsurface. Following the nitride deposition, the outer silica layer (actually the third layer in the composite) is preferably produced by plasma deposition of silica.

BRIEF DESCRIPTION OF THE FIGURES

FIG. 4 is also a diagramatic illustration of the semi-conductor device claimed herein.

DETAILED DESCRIPTION OF THE INVENTION

The present invention is based upon a finding that when semi-conductor devices with conventional two layer passivation layers of nitride over silica are etched (to form terminal areas), the silica underlying the nitride tends to be undercut in the etching process. This permits the subsequently deposited titanium tungsten metallic sublayer to spread outwardly under the nitride and into the excessively etched underlying silica of the passivation coating.

As a result of the excessive etching at the edge of the nitride layer, the silica is etched to a much greater degree than in that part of the silica away from the nitride overlayer. This creates a crack in the titanium tungsten metallic sublayer. As a result, the metallic sublayer becomes ineffective to prevent the aluminum from interdiffusing toward the silicon. The result is a tendency to produce Schottky barrier shorts or direct electrical shorts between the aluminum metallic sublayer and the underlying silicon surface, with a resultant defect in the manufactured product.

This defect is avoided, in accordance with the present invention, by providing only the minimum thickness of silica subsurface under the nitride overlayer. The remaining silica required for the barrier or passivation coating is then provided as an overcoating on the nitride. At that point whatever thickness is necessary to produce the desired barrier properties or capacitance of the passivation coating determines the thickness of the outer layer. The initial silica layer, however, is limited as previously indicated, to a thickness on the order of 300–500 Å. Typically, the silica outer layer of the composite passivation coating of this invention may be on the order of 2000–3000 Å (to produce a total silica thickness in the composite barrier coating on the order of 2300–3500Å), but this is entirely dependent on circuit design considerations.

Figure 1:
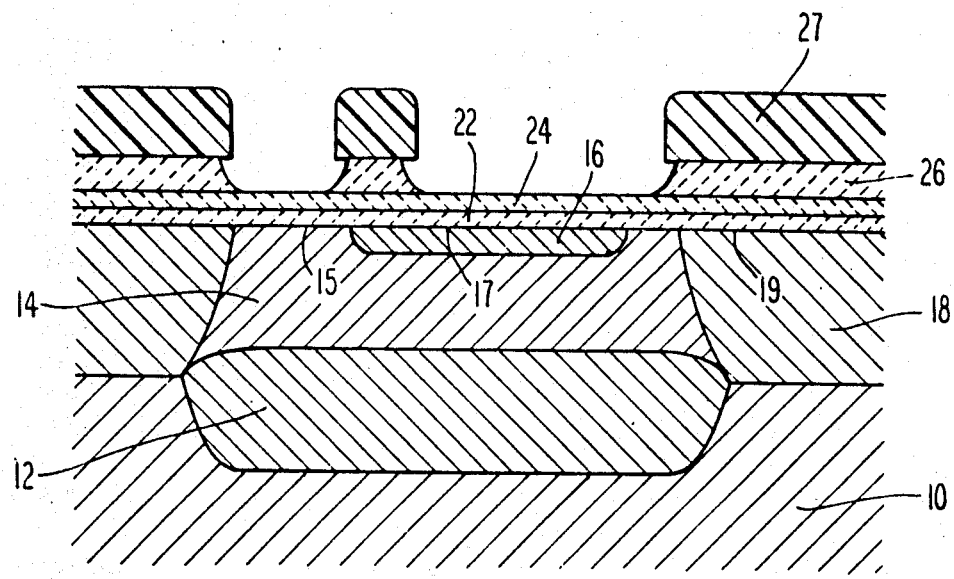
FIG. 1 is a diagramatic illustration of a semi-condutor device at one stage of the manufacturing process in accordance with the present invention.

With reference to the figures, the method and product of the present invention may be better understood by reference first of all to FIG. 1. There is shown, at a preliminary manufacturing stage, a semi-conductor device comprising a silicon wafer or chip 10 with a functional semi-conductor area thereon. The functional semi-conductor area comprises a buried layer 12, an epitaxial N type silicon layer 14 and a base layer 16, all electrically separated from surrounding areas by an isolation barrier 18, typically a doped silicon segment of the silicon surface. The surface portion 19 of isolation barrier 18 together with surface portion 17 of base area 16 and surface portion 15 of epitaxial segment 14 together comprise the surface of the semi-conductor device of this invention.

In order to form the appropriate barrier coating over this surface and the necessary terminals and connective leads making electrical contact therewith, the surface of wafer 10 is first oxidized to a depth on the order of 300–500 Å, preferably about 400 Å, to form a layer of silica 22 roughly the minimum thickness necessary to prevent interdiffusion or reaction between the underlying silicon surface and a nitride barrier layer to be placed thereover. Nitride layer 24 is then deposited over oxidized silica layer 22. The respective silica and nitride layers 22 and 24 are formed by conventional techniques, i.e., exposure of the wafer to a hot (about 800° C.) oxygen atmosphere and then to a low pressure (about 200 mtorr), high temperature (about 800° C.) nitride-depositing atmosphere (e.g., $NH_3$ and $SiCl_2H_2$) for time periods sufficient to produce the desired depths.

A third layer 26, again of silica, is then deposited over the nitride. For this purpose plasma glass deposition is preferred, preferably from a silane-nitrous oxide atmosphere at elevated temperatures on the order of about 340° C. for example. The thickness of silica layer 26 is determined by the necessary capacitance of the overall composite barrier layer formed by silica layers 22 and 26 and nitride layer 24 and by the necessity for providing silica as a diffusion barrier of sufficient thickness.

Thereafter, areas 17 and 15 are prepared for the deposition of base and collector contacts by the selective etching (with a buffered oxide etchant, such as a 6:1 solution of HF in water), using a photoresist mask 27, of silica layer 24 in that part of silica layer 24 overlying areas 17 and 15, as seen in FIG. 1.

Figure 2:
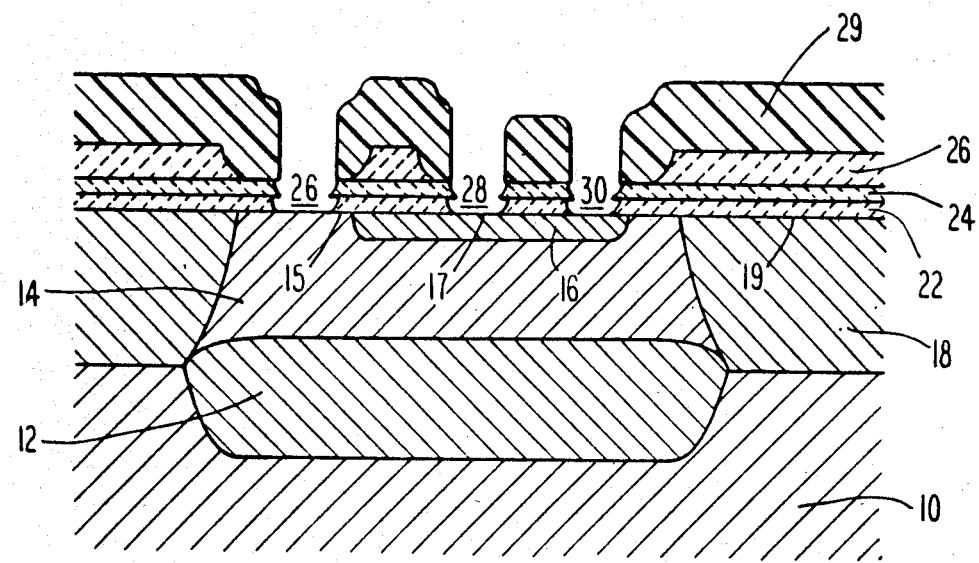
FIGS. 2, 3 and 4 are diagramatic illustrations of the same device at subsequent stages of the manufacturing process.

As seen in FIG. 2, a separate mask 29 and subsequent etch of the nitride layer (with, for example, carbon tetrafluoride and oxygen at reduced pressure) and further etching of the underlying silica layer 22 (again by a buffered oxide etch solution) produces collector contact area 26, emitter contact area 28 and base contact area 30 in selected segments of the functional semi-conductor surface portion of the semi-conductor device.

Figure 3:
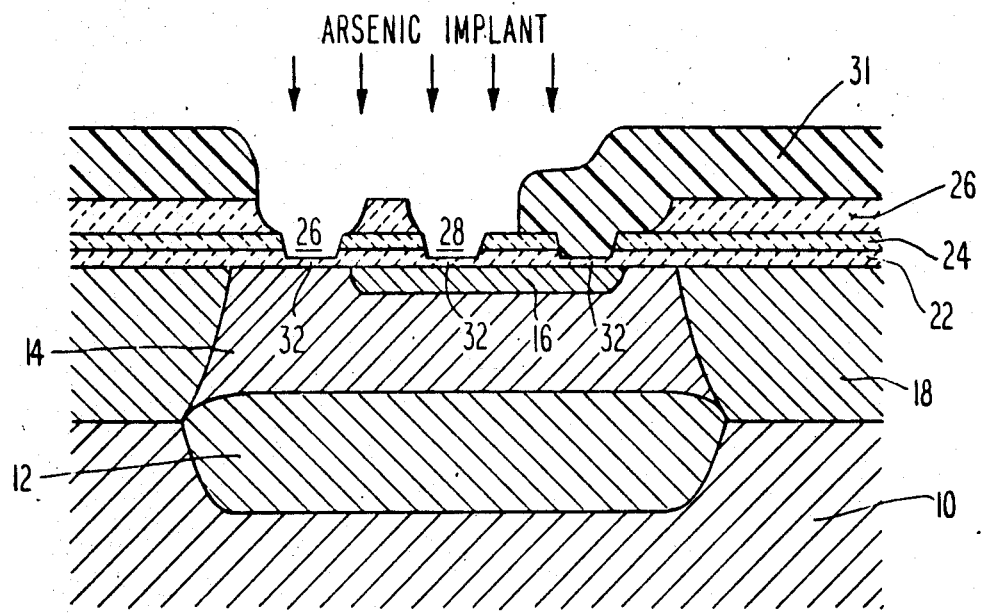

Areas 26, 28, and 30 are then surface oxidized to a depth of about 200 Å to form silica layer 32, as seen in FIG. 3.

Preferably, an emitter dopant, such as arsenic, is then deposited through still another photoresist mask 31, in the collector and emitter contact areas 26 and 28. Typically, implantation occurs by high energy vaporization of the emitter dopant, such as the excitation of arsenic at about 70 kilo electron volts, to form a modified silicon structure 50 at the surface of those areas.

Figure 4:
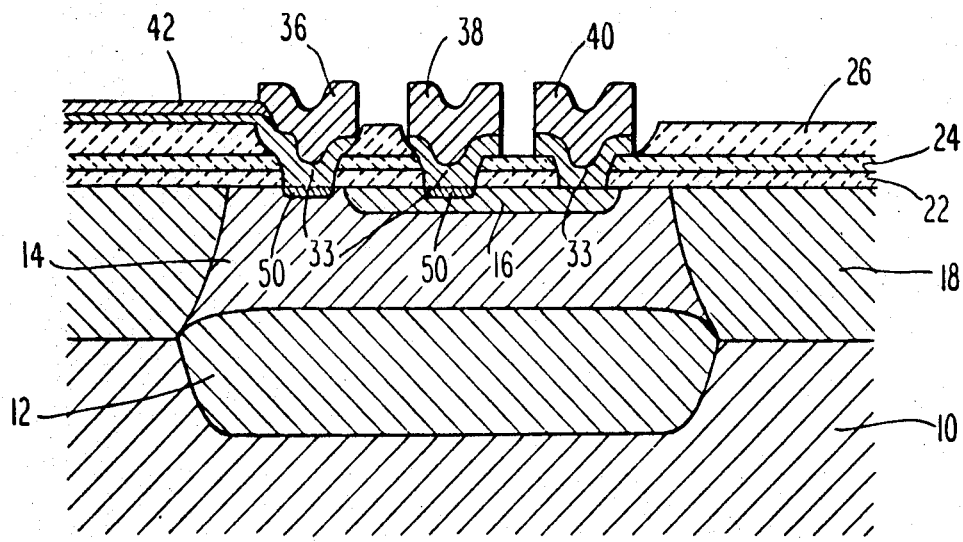

Removal of photoresist layer 31 and silicon layers 32 (seen in FIG. 3), then permits the deposition, as seen in FIG. 4, of a tungsten titanium metal interface layer 33 in the contact areas 26, 28, 30, and in other areas subsequently to be overcoated by sputtered aluminum terminals 36, 38 and 40 and lead 42.

As seen in FIG. 4, aluminum contacts 40, 42, and 44 forming the collector contact, the emitter contact, and the base contact, respectively, are also in turn connected with electrically conductive sputtered aluminum lead 42.

The present invention differs from similar devices and methods of the prior art primarily in that the sandwich composite diffusion barrier provided by inner silica layer 22, nitride layer 24, and outer silicon layer 26 have heretofore been provided in a two-part composite consisting only of an inner silica layer, much thicker than that used in the present invention, and a nitride over-layer. As previously indicated, successive etching of the nitride and silica components of the prior art barrier to bare collector, emitter, and base surfaces, however, typically produces a certain amount of lateral etching of the lower or inner silica layer of the composite under the nitride over-layer. With the thicker inner or lower silica layer of the prior art typically on the order of 3000 Å (as compared to the thin silica layer 22 of the present invention, typically on the order of 300–500 Å), it has been found that this often results in a severe undercut portion into which the subsequently deposited titanium-tungsten metallic underlayer extends. This produces a a high risk of electrical short circuits or Schottky barrier junctions between the metallic contacts and a portion of the device surface in the vicinity of the emitter, base, or collector surface.

Such defects have been found to be the primary cause of a high proportion of defectively manufactured semiconductor devices using the composite barrier coating of the prior art. In comparison, using the three-part or sandwich composite barrier coating of the present invention with a minimum thickness silica layer underlying the nitride of the barrier, this etchant undercutting of the nitride is minimized. This has been demonstrated quantitatively in the commercial manufacture of devices with composite barrier coatings of the types described above. With no other change in the product or process, other than conversion from the conventional two layer coating to the sandwich construction of this invention, the yield of the manufacturing process (number of acceptable devices produced over total number produced $\times 100$) increased by 38%.

It is apparent that the present invention may be utilized in the forming of any semi-conductor device having a silicon base and a functional semi-conductor area and metallic contacts formed over portions of that area and further including a composite silica-nitride barrier or passivation coating against atmospheric and metallic ion diffusion into the silicon base of the device. Moreover, this invention finds particular utility in those circuit designs wherein the composite barrier layer is required to have a certain minimum thickness for barrier properties and for capacitance, which would otherwise result in an excessive silica thickness under the nitride layer.

While this invention has been described with reference to particular embodiments thereof, it is not limited thereto. Instead, the appended claims are intended to be construed to encompass not only those forms of the invention illustrated and described, but to such other forms and variations thereof as may be devised by those skilled in the art without departing from the true spirit and scope of this invention.

What is claimed is:

1. A semi-conductor device comprising a silicon base with a functional semi-conductor area on the surface thereof and a metallic contact layer overlying and in contact with at least a portion of said semi-conductor area, said device further including a composite passivation coating overlying substantially all of the remainder of said device surface, said metallic contact coating including at least one conductive lead extending from a contact point with said underlying semi-conductor area, said conductive lead also overlying said composite passivation coating, said composite passivation coating comprising a first relatively thin (300–500 Å) silica layer in contact with said device surface, a second nitride layer overlying said first silica layer, and a third silica layer overlying said second layer and interposed between said nitride layer and said overlying conductive lead, the thickness of said third silica layer being 2400–3000 Å, so as to provide, in combination with said first silica layer, preselected electrical characteristics, and to substantially eliminate the adverse effects of undercut of said nitride layer by excessive etching of said first silica layer.

2. A semi-conductor device, as recited in claim 1, wherein said third silica layer overlies substantially all of said second nitride layer.

* * * * *